United States Patent
Hong et al.

(10) Patent No.: US 9,698,291 B2
(45) Date of Patent: Jul. 4, 2017

(54) SOLAR CELL PANEL AND METHOD FOR MANUFACTURING THE SAME

(75) Inventors: Jongkyoung Hong, Seoul (KR); Jongdae Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 53 days.

(21) Appl. No.: 13/164,349

(22) Filed: Jun. 20, 2011

(65) Prior Publication Data
US 2012/0103385 A1    May 3, 2012

(30) Foreign Application Priority Data
Oct. 28, 2010   (KR) .................. 10-2010-0105855

(51) Int. Cl.
| | | |
|---|---|---|
| *H01L 31/00* | (2006.01) | |
| *H01L 31/042* | (2014.01) | |
| *H02N 6/00* | (2006.01) | |
| *H01L 31/05* | (2014.01) | |
| *H01L 31/0236* | (2006.01) | |
| *H01L 31/054* | (2014.01) | |
| *H01L 31/02* | (2006.01) | |

(52) U.S. Cl.
CPC ...... *H01L 31/0508* (2013.01); *H01L 31/0236* (2013.01); *H01L 31/05* (2013.01); *H01L 31/0504* (2013.01); *H01L 31/0547* (2014.12); *H01L 31/02013* (2013.01); *Y02E 10/50* (2013.01); *Y02E 10/52* (2013.01)

(58) Field of Classification Search
CPC .... H01L 31/05–31/0512; H01L 31/042; H01L 31/02013; H01L 31/0236; Y02E 10/50
USPC .............. 136/244, 251, 252, 256, 259, 293
See application file for complete search history.

(56) References Cited

U.S. PATENT DOCUMENTS

| | | | | |
|---|---|---|---|---|
| 4,343,962 A | * | 8/1982 | Neugroschel et al. | 136/255 |
| 2002/0139415 A1 | * | 10/2002 | Shimizu et al. | 136/256 |
| 2006/0272843 A1 | * | 12/2006 | Berghofer et al. | 174/94 R |
| 2007/0295381 A1 | * | 12/2007 | Fujii et al. | 136/244 |
| 2009/0032081 A1 | * | 2/2009 | Saita et al. | 136/244 |
| 2010/0116314 A1 | * | 5/2010 | Fukushima et al. | 136/244 |
| 2010/0126551 A1 | * | 5/2010 | Okamoto et al. | 136/244 |

FOREIGN PATENT DOCUMENTS

| | | |
|---|---|---|
| JP | 2005-302902 A | 10/2005 |
| JP | 2006-80217 A | 3/2006 |
| JP | 2008-135652 A | 6/2008 |
| JP | 2008-147567 A | 6/2008 |

* cited by examiner

*Primary Examiner* — Lindsey Bernier
(74) *Attorney, Agent, or Firm* — Birch, Stewart, Kolasch & Birch, LLP

(57) ABSTRACT

A solar cell panel and a method for manufacturing the same are discussed. The solar cell panel includes a plurality of solar cells each including a substrate and a plurality of electrode parts positioned on a surface of the substrate, an interconnector electrically connecting the electrode parts of adjacent ones of the plurality of solar cells to one another, and conductive adhesive films including a resin and a plurality of conductive particles dispersed in the resin. The conductive adhesive films is pressed between the electrode parts and the interconnector to electrically connect the electrode parts to the interconnector. A plurality of uneven portions are positioned on at least one of an upper surface and a lower surface of the interconnector.

11 Claims, 6 Drawing Sheets

SOLAR CELL PANEL AND METHOD FOR MANUFACTURING THE SAME

This application claims priority to and the benefit of Korean Patent Application No. 10-2010-0105855 filed in the Korean Intellectual Property Office on Oct. 28, 2010, the entire contents of which are incorporated herein by reference.

BACKGROUND OF THE INVENTION

Field of the Invention

Embodiments of the invention relate to a solar cell panel and a method for manufacturing the same in which adjacent solar cells are electrically connected to one another using an interconnector.

Description of the Related Art

Solar power generation to convert light energy into electric energy using a photoelectric conversion effect has been widely used as a method for obtaining eco-friendly energy. A solar power generation system using a plurality of solar cell panels has been installed in places, such as houses due to an improvement in a photoelectric conversion efficiency of solar cells.

The solar cell panel includes an interconnector for electrically connecting a plurality of solar cells to one another, front and back protective members for protecting the solar cells, and a sealing member that is positioned between the front and back protective members to seal the solar cells.

The interconnector is formed of a conductive metal or is formed of a conductive metal and a solder coated on the surface of the conductive metal. The interconnector is connected to electrode parts of the solar cells using infrared rays, a heated gas, a local heating material, a laser, etc.

However, the sizes of light receiving surfaces of the solar cells of the solar cell panel are reduced because of the interconnector. In other words, because the sizes of the light receiving surfaces of the solar cells are reduced by the size occupied by the interconnector, photoelectric conversion efficiency of the solar cell panel is reduced.

Recently, the solar cells are electrically connected to one another using an interconnector having an uneven surface, so as to minimize such a problem. In the solar cell panel using the interconnector having the uneven surface, a portion of light incident on the light receiving surfaces (i.e., light incident on the uneven surface of the interconnector) of the solar cells is reflected from the uneven surface of the interconnector and then is again incident on the light receiving surfaces of the solar cells due to a scattering effect.

However, because the interconnector having the above-described configuration carries out the electrical connection by melting the solder, the uneven surface of the interconnector is damaged because of heat and/or pressure applied during a tabbing process.

SUMMARY OF THE INVENTION

In one aspect, there is a solar cell panel including a plurality of solar cells, each solar cell including a substrate and a plurality of electrode parts positioned on a surface of the substrate, an interconnector configured to electrically connect respective electrode parts of adjacent ones of the plurality of solar cells to one another, and conductive adhesive films including a resin and a plurality of conductive particles dispersed in the resin, the conductive adhesive films being pressed between the plurality of electrode parts and the interconnector to electrically connect the plurality of electrode parts to the interconnector, wherein a plurality of uneven portions are positioned on at least one of an upper surface and a lower surface of the interconnector.

The interconnector may include a conductive metal and a solder coated on a surface of the conductive metal. The resin of the conductive adhesive films may be formed of a material having a melting temperature lower than a material of the solder.

The plurality of electrode parts include a front electrode part positioned on a front surface of the substrate and a back electrode part positioned on a back surface of the substrate.

The front electrode part includes a plurality of front electrodes and a plurality of front electrode current collectors positioned in a direction crossing the plurality of front electrodes. The plurality of front electrodes and the plurality of front electrode current collectors are connected to an emitter layer positioned at the front surface of the substrate.

The back electrode part includes a back electrode and a back electrode current collector that are positioned on the back surface of the substrate. The back electrode current collector is positioned in a direction parallel to the plurality of front electrode current collectors.

The plurality of uneven portions is positioned on the upper surface of the interconnector. In this instance, the plurality of front electrode current collectors and the interconnector are attached to each other using the conductive adhesive films, so that the lower surface of the interconnector is positioned opposite the plurality of front electrode current collectors. Further, the back electrode current collector and the interconnector are attached to each other using one of the conductive adhesive films, so that the upper surface of the interconnector is positioned opposite the back electrode current collector.

A space between the uneven portions positioned on the upper surface of the interconnector is filled with a portion of the conductive adhesive film. Further, the space is filled with the resin of the conductive adhesive film or the plurality of conductive particles of the conductive adhesive film.

In another aspect, there is a method for manufacturing a solar cell panel electrically connecting a plurality of solar cells each including a plurality of electrode parts positioned on a surface of a substrate to one another, the method including preliminarily pressing conductive adhesive films, that includes a resin and a plurality of conductive particles dispersed in the resin, on the plurality of electrode parts, aligning and preliminarily fixing an interconnector, that includes a conductive metal, a solder coated on a surface of the conductive metal, and a plurality of uneven portions positioned on at least one of an upper surface and a lower surface of the interconnector, on the preliminarily pressed conductive adhesive films, and primarily pressing the interconnector on the conductive adhesive films to electrically connect the plurality of electrode parts to the interconnector using the conductive adhesive films, wherein the primarily pressing of the interconnector includes pressing the interconnector using a heating tool, that is heated to a temperature lower than a melting temperature of the solder, to melt the resin of the conductive adhesive films.

The primarily pressing of the interconnector may include pressing the interconnector using the heating tool, that is heated to a temperature of about 140° C. to 200° C., at a pressure of about 1.0 MPa to 5.0 MPa for about 5 seconds to 15 seconds. The preliminarily pressing of the conductive adhesive films may include pressing the conductive adhesive films using the heating tool, that is heated to a temperature of about 60° C. to 120° C., at a pressure of about 0.5 MPa to 1.5 MPa for about 1 second to 10 seconds.

According to the above-described characteristics, the tabbing process may be performed at a low temperature, for example, at about 140° C. to 200° C. As discussed above, when the tabbing process is performed at the low temperature, the tabbing process may be performed at a temperature equal to or lower than a melting temperature of the solder of the interconnector. Therefore, after the tabbing process is performed, the plurality of uneven portions formed on the surface of the solder may have the good surface shape.

Accordingly, because light incident on the upper surface of the interconnector is reflected from the plurality of uneven portions of the interconnector and then is again incident on the substrate, light receiving areas of the solar cells increase.

Further, a bowing phenomenon and a damage of the substrate may be prevented or reduced more sufficiently or readily as compared to when the tabbing process is performed using soldering.

Further, because the flux is not used, an adhesive strength may be uniformly maintained, and a misalignment may be prevented or reduced. Hence, an output reduction thereof may be prevented or reduced.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
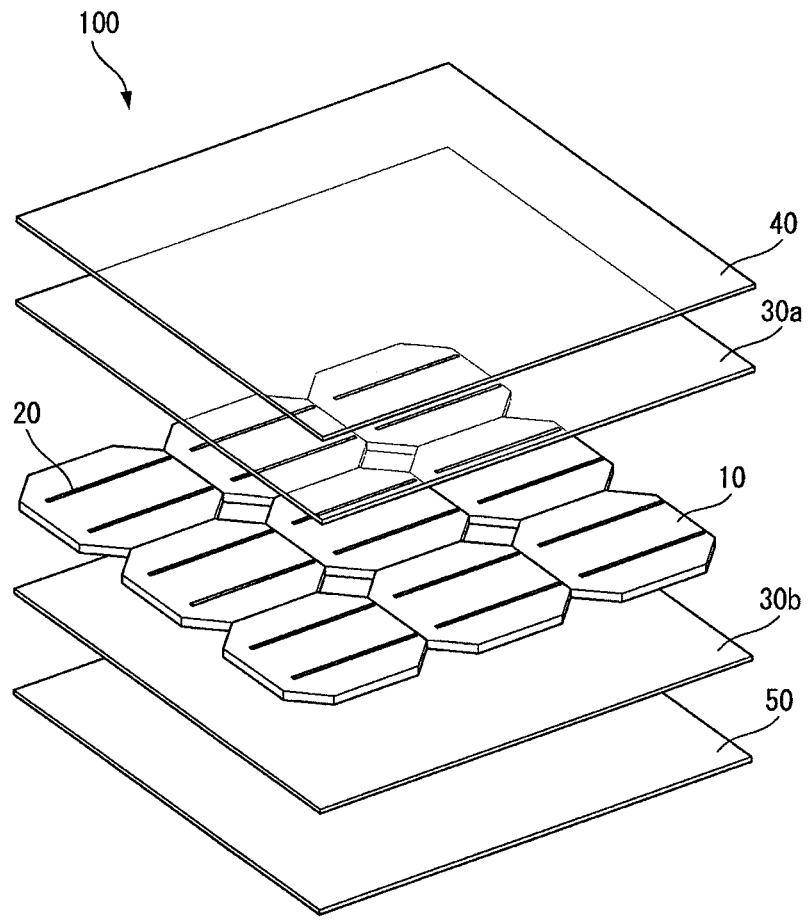
FIG. 1 is an exploded perspective view of a solar cell panel according to an example embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

FIG. 1 is an exploded perspective view of a solar cell panel according to an example embodiment of the invention. As shown in FIG. 1, a solar cell panel 100 according to an example embodiment of the invention includes a plurality of solar cells 10, interconnectors 20 for electrically connecting the solar cells 10 to one another, front and back protective layers 30a and 30b for protecting the solar cells 10, a transparent member 40 positioned on the front protective layer 30a on light receiving surfaces of the solar cells 10, and a back sheet 50 underlying the back protective layer 30b on surfaces opposite the light receiving surfaces of the solar cells 10.

The back sheet 50 prevents moisture or oxygen from penetrating into a back surface of the solar cell panel 100, thereby protecting the solar cells 10 from an external environment. The back sheet 50 may have a multi-layered structure including a moisture/oxygen penetrating prevention layer, a chemical corrosion prevention layer, a layer having insulating characteristics, etc.

In the case of a double-sided light receiving solar cell, a transparent sheet such as a glass substrate or a resin substrate having a light transparency may be used instead of the back sheet 50.

The front and back protective layers 30a and 30b, and the solar cells 10 form an integral body when a lamination process is performed in a state where the front and back protective layers 30a and 30b are respectively positioned on front surfaces and back surfaces of the solar cells 10. The front and back protective layers 30a and 30b prevent corrosion of metal resulting from the moisture penetration and protect the solar cells 10 from an impact. The front and back protective layers 30a and 30b may be formed of a material such as ethylene vinyl acetate (EVA). Other materials may be used for the front and back protective layers 30a and 30b.

The transparent member 40 on the front protective layer 30a may formed of a tempered glass having a high light transmittance and excellent damage prevention characteristic. The tempered glass may be a low iron tempered glass containing a small amount of iron. The transparent member 40 may have an embossed inner surface so as to increase a scattering effect of light. Other materials may be used for the transparent member 40.

As shown in FIG. 1, the plurality of solar cells 10 is arranged in a matrix structure. The number of solar cells 10 arranged in row and/or column directions may vary, if necessary or desired.

Figure 2:
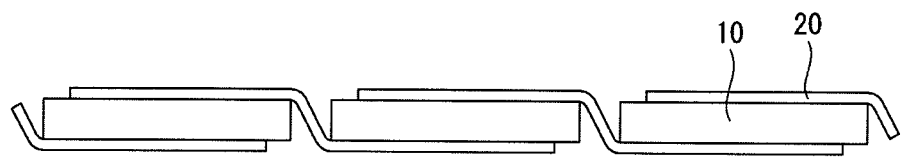
FIG. 2 schematically illustrates an electrical connection structure between a plurality of solar cells of the solar cell panel shown in FIG. 1.

As shown in FIG. 2, the plurality of solar cells 10 are electrically connected to one another using the interconnectors 20. More specifically, an electrode part formed on a front surface of one solar cell 10 is electrically connected to an electrode part formed on a back surface of another solar cell 10 adjacent to the one solar cell 10 using an interconnector 20 in a state where the plurality of solar cells 10 are positioned adjacently to one another.

Figure 3:
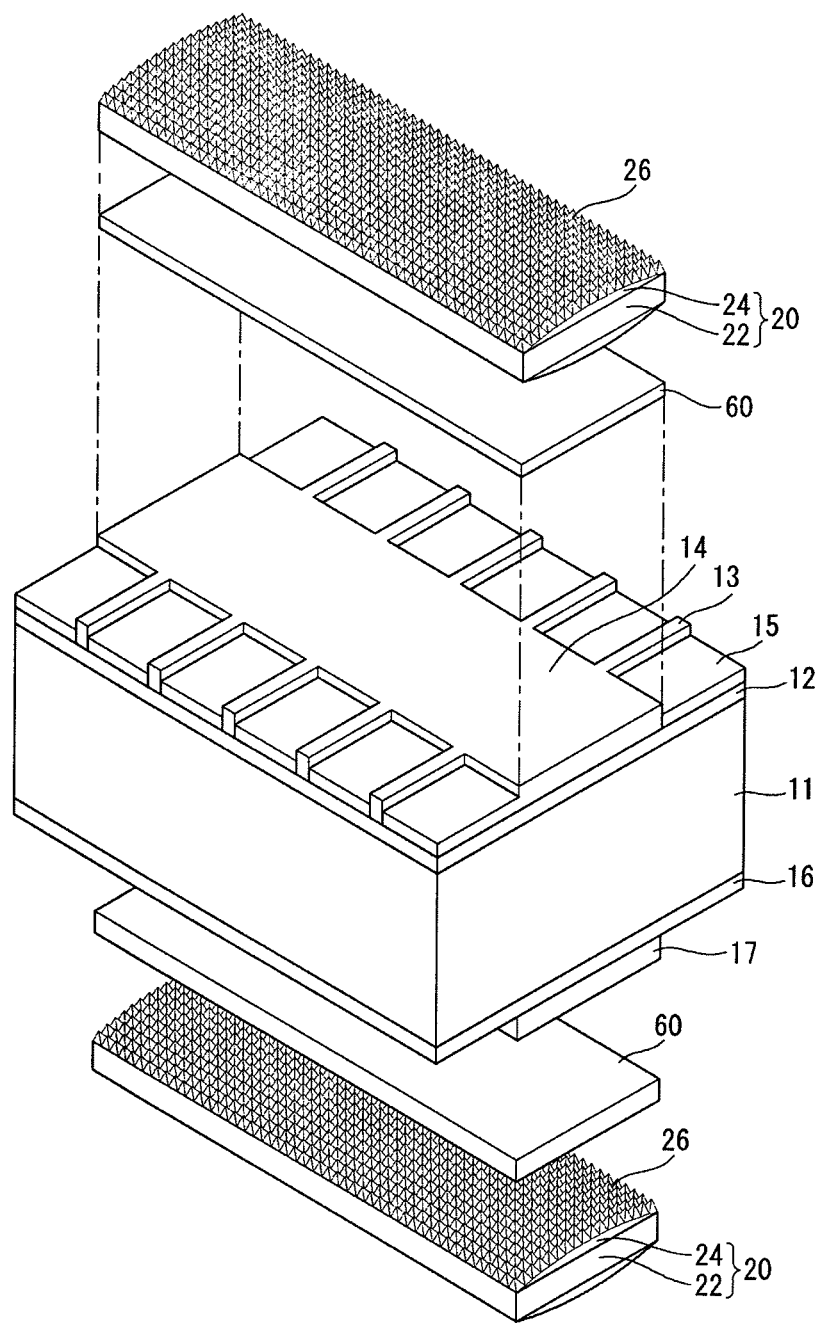
FIG. 3 is an exploded perspective view illustrating a configuration of a solar cell in the solar cell panel shown in FIG. 1.

FIG. 3 is an exploded perspective view illustrating a configuration of a solar cell in the solar cell panel shown in FIG. 1.

As shown in FIG. 3, the solar cell 10 includes a substrate 11, an emitter layer 12 positioned at a front surface (for example, a light receiving surface on which light is incident) of the substrate 11, a plurality of front electrodes 13 positioned on the emitter layer 12, a plurality of front electrode current collectors 14 that are positioned on the emitter layer 12 in a direction crossing the front electrodes 13, an anti-reflection layer 15 positioned on the emitter layer 12 on which the front electrodes 13 and the front electrode current collectors 14 are not positioned, a back electrode 16 positioned on a surface (i.e., a back surface) opposite the light receiving surface of the substrate 11, and a back electrode current collector 17 positioned on the same plane (or the same stratum) as the back electrode 16 or on a back surface of the back electrode 16.

The solar cell 10 may further include a back surface field (BSF) layer between the back electrode 16 and the substrate 11. The back surface field layer may be a region (for example, a $p^+$-type region) that is more heavily doped with impurities of the same conductive type as the substrate 11 than the substrate 11. The back surface field layer may serve as a potential barrier. Thus, because the back surface field layer may prevent or reduce a recombination and/or a disappearance of electrons and holes around the back surface of the substrate 11, the efficiency of the solar cell 10 may be improved.

The substrate 11 is a semiconductor substrate, which may be formed of first conductive type silicon, for example, p-type silicon, though not required. Silicon used in the substrate 11 may be single crystal silicon, polycrystalline silicon, or amorphous silicon. When the substrate 11 is of a p-type, the substrate 11 contains impurities of a group III element such as boron (B), gallium (Ga), and indium (In). Other semiconductors may be used to form the substrate 11.

The surface of the substrate 11 may be textured to form a textured surface corresponding to an uneven surface or having uneven characteristics having a plurality of uneven portions. When the surface of the substrate 11 is the textured surface, a light reflectance in the light receiving surface of the substrate 11 is reduced. Further, because both a light incident operation and a light reflection operation are performed on the textured surface of the substrate 11, light is confined in the solar cell 10. Hence, light absorption increases, and the efficiency of the solar cell 10 is improved. In addition, because a reflection loss of light incident on the substrate 11 decreases, an amount of light incident on the substrate 11 further increases.

The emitter layer 12 is a region doped with impurities of a second conductive type (for example, an n-type) opposite the first conductive type of the substrate 11. The emitter layer 12 forms a p-n junction along with the substrate 11. When the emitter layer 12 is to be of the n-type, the emitter layer 12 may be formed by doping the substrate 11 with impurities of a group V element such as phosphor (P), arsenic (As), and antimony (Sb).

When energy of light incident on the substrate 11 is applied to the semiconductors of the substrate 11, carriers (for example, electron-hole pairs) are produced inside the semiconductors, and electrons move to the n-type semiconductor and holes move to the p-type semiconductor. Thus, when the substrate 11 is of the p-type and the emitter layer 12 is of the n-type, the holes move to the p-type substrate 11 and the electrons move to the n-type emitter layer 12.

Alternatively, the substrate 11 may be of an n-type and/or may be formed of semiconductor materials other than silicon. When the substrate 11 is of the n-type, the substrate 11 may contain impurities of a group V element such as phosphorus (P), arsenic (As), and antimony (Sb).

Because the emitter layer 12 forms the p-n junction along with the substrate 11, the emitter layer 12 is of the p-type when the substrate 11 is of the n-type. In this instance, electrons move to the n-type substrate 11 and holes move to the p-type emitter layer 12.

When the emitter layer 12 is of the p-type, the emitter layer 12 may be formed by doping a portion of the substrate 11 with impurities of a group III element such as boron (B), gallium (Ga), and indium (In).

The anti-reflection layer 15 on the emitter layer 12 may be formed of silicon nitride (SiNx), silicon dioxide ($SiO_2$), or titanium dioxide ($TiO_2$). The anti-reflection layer 15 reduces a reflectance of light incident on the solar cell 10 and increases a selectivity of a predetermined wavelength band of the incident light, thereby increasing the efficiency of the solar cell 10. The anti-reflection layer 15 may have a thickness of about 70 nm to 80 nm. The anti-reflection layer 14 may be omitted, if desired.

The plurality of front electrodes 13 on the emitter layer 12 are electrically and physically connected to the emitter layer 12 and are formed in one direction in a state where the front electrodes 13 are spaced apart from one another. Each of the front electrodes 13 collects carriers (e.g., electrons) moving to the emitter layer 12. Each of the front electrodes 13 is formed of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used for the front electrodes 13.

For example, the front electrodes 13 may be formed of an Ag paste containing lead (Pb). In this instance, the front electrodes 13 may be electrically connected to the emitter layer 12 by way of a process in which the Ag paste is coated on the anti-reflection layer 15 using a screen printing method and the substrate 11 is fired at a temperature of about 750° C. to 800° C. The electrical connection between the front electrodes 13 and the emitter layer 12 is carried out by etching the anti-reflection layer 15 using the lead (Pb) contained in the Ag paste during the firing process and bringing Ag particles of the Ag paste into contact with the emitter layer 12.

The front electrode current collectors 14 are electrically and physically connected to the emitter layer 12 and the front electrodes 13. Thus, the front electrode current collectors 14 output carriers (e.g., electrons) transferred from the front electrodes 13 to an external device. The front electrode current collectors 14 are formed of at least one conductive material. The conductive material used for the front electrode current collectors 14 may be at least one selected from the group consisting of Ni, Cu, Ag, Al, Sn, Zn, In, Ti, Au, and a combination thereof. Other conductive materials may be used.

The front electrode current collectors 14 may be electrically connected to the emitter layer 12 through a punch through operation by way of a process in which the conductive material is coated on the anti-reflection layer 15, patterned, and fired, in the same manner as the front electrodes 13.

The back electrode 16 is formed on the surface (i.e., the back surface of the substrate 11) opposite the light receiving surface of the substrate 11. The back electrode 16 collects carriers (e.g., holes) moving to the substrate 11. The back electrode 16 is formed of at least one conductive material. The conductive material may be at least one selected from the group consisting of Ni, Cu, Ag, Al, Sn, Zn, In, Ti, Au, and a combination thereof. Other conductive materials may be used for the back electrode 16.

The back electrode current collector 17 may positioned on the same plane (or the same stratum) as the back electrode 16 or on the back electrode 16. The back electrode current collector 17 is formed in a direction crossing the front electrodes 13, i.e., in a direction parallel to the front electrode current collectors 14. The back electrode current collector 17 is electrically connected to the back electrode 16. Thus, the back electrode current collector 17 outputs carriers (e.g., holes) transferred from the back electrode 16 to an external device. The back electrode current collector 17 is formed of at least one conductive material. The conductive material used for the back electrode current collector 17 may be at least one selected from the group consisting of Ni, Cu, Ag, Al, Sn, Zn, In, Ti, Au, and a combination thereof. Other conductive materials may be used.

Conductive adhesive films 60 are respectively positioned on the front electrode current collectors 14 and the back electrode current collector 17 of the solar cell 10. The interconnectors 20 are respectively positioned on the conductive adhesive films 60. For convenience of description, conductive adhesive films 60 positioned on the front electrode current collectors 14 may be referred to as front conductive adhesive films 60 and conductive adhesive films 60 positioned on the back electrode current collector 17 may be referred to as back conductive adhesive films 60. Additionally, portions of the interconnectors 20 on the front conductive adhesive films 60 may be referred to as front portions of the interconnectors 20, and portions of the interconnectors 20 on the back conductive adhesive films 60 may be referred to as back portions of the interconnectors 20.

As shown in FIG. 3, the interconnector 20 includes a conductive metal 22 formed of a lead-free material (or a substantially lead-free material) containing an amount of lead (Pb) equal to or less than 1,000 ppm, and solders 24 that are respectively coated on at least one of an upper surface and a lower surface of the conductive metal 22 and formed of a material containing lead.

A plurality of uneven portions 26 are formed on a surface of the interconnector 20, such as an upper surface of the interconnector 20, i.e., an upper surface of the solder 24 positioned on the upper surface of the conductive metal 22. The uneven portions 26 of the interconnector 20 reflect light incident on the interconnector 20 and cause the light to be again incident on the light receiving surface of the solar cell 10. In embodiments of the invention, an upper surface refers to a surface of a unit that faces a light incident direction. Thus, in FIG. 3, the upper surface refers to surfaces that face the upper part of the FIG. 3. In an embodiment of the invention, the plurality of uneven portions 26 may be formed on one or more portions of a surface of the interconnector 20, for example, at portions of the interconnector 20 that contact the adhesive conductive film 60 and/or at portions that overlap the substrate 11. The plurality of uneven portions 26 may be formed at other portions on the surface of the interconnector 20.

Each of the uneven portions 26 may have various shapes, such as a pyramid shape shown in FIG. 3. The pyramid shape may have four inclined surfaces, and an angle between two opposite inclined surfaces of the four inclined surfaces may be about 100° to 140°.

When the angle between the two opposite inclined surfaces is about 100° to 140°, at least about 20% of light incident on the upper surface of the interconnector 20 is totally reflected from the inclined surfaces of the uneven portions 26 and then is again incident on the anti-reflection layer 15. Thus, absorption of light in the light receiving surface of the solar cell 10 efficiently increases.

An aspect ratio (i.e., a ratio of a thickness to a width) of each of the uneven portions 26 may be set to about 1 to 2.

FIG. 3 shows the uneven portions 26 having uniform size. However, the uneven portions 26 may have non-uniform size or different sizes. Since it would be within the skills of those skilled in the art to form the uneven portions 26 having the non-uniform size, a separate drawing is not accompanied.

Further, FIG. 3 shows the uniformly distributed uneven portions 26. However, the uneven portions 26 may be non-uniformly distributed and may be distributed in an island shape, for example.

As discussed above, the uneven portions 26 positioned on the upper surface of the interconnector 20 (i.e., the upper surface of the solder 24 positioned on the upper surface of the conductive metal 22) may have the uniform or non-uniform size and may be uniformly or non-uniformly distributed.

Further, the uneven portions 26 may have a linear prism shape having uniform size. The linear prism shape may have two inclined surfaces, and an angle between the two inclined surfaces may be about 100° to 140°.

When the angle between the two inclined surfaces is about 100° to 140°, at least about 20% of light incident on the upper surface of the interconnector 20 is totally reflected from the inclined surfaces of the uneven portions 26 and then is again incident on the anti-reflection layer 15.

The linear prism-shaped uneven portions 26 may have the uniform or non-uniform size and may be uniformly or non-uniformly distributed in the same manner as the pyramid-shaped uneven portions 26.

When the linear prism-shaped uneven portions 26 have the non-uniform size, the uneven portion 26 has an increasing width going from a central portion to an end of the interconnector 20 in a width direction of the interconnector 20 or from an end to a central portion of the interconnector 20 in the width direction of the interconnector 20.

In other embodiments, the uneven portions 26 on the upper surface of the interconnector 20 may have an oblique prism-shape having the uniform size, or may be formed in a groove having a semicircle or a semi-oval cross section.

As discussed above, the uneven portions 26 having various shapes, cross sections, widths, thicknesses, etc., may be formed on a surface, such as the upper surface of the interconnector 20 in various patterns.

The interconnector 20 may include only the conductive metal 22. In this instance, the uneven portions 26 may be formed on the upper surface of the conductive metal 22. Alternatively, the uneven portions 26 may be formed on both the upper surface and the lower surface of the interconnector 20.

Figure 4:
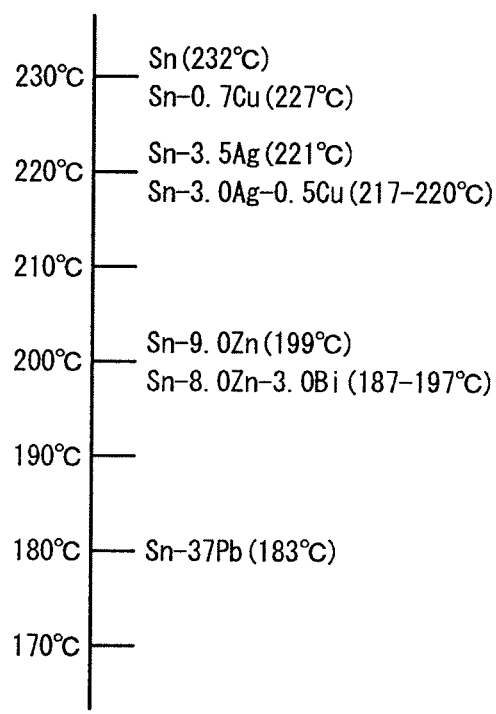
FIG. 4 is a graph indicating a melting temperature depending on a material of a solder.

The solder 24 may be formed of at least one material selected among the metal material such as bismuth (Bi), tin (Sn), lead (Pb), silver (Ag), zinc (Zn), and copper (Cu). As shown in FIG. 4, the solder 24 formed of the above metal material is melted at a temperature equal to or higher than about 180° C. FIG. 4 illustrates a melting temperature of the solder 24 depending on the material of the solder 24.

As discussed above, the solder 24 is melted at the high temperature equal to or higher than about 180° C. depending on the material thereof. Therefore, when a tabbing process is performed through a soldering process using a flux, the tabbing process has to be performed at a temperature equal to or higher than the melting temperature of the solder 24. Hence, the surface shape of the uneven portions 26 formed on the upper surface of the solder 24 is damaged.

Further, the substrate may be bent because of the high process temperature, microcracks may appear because of the use of flux and the soldering process may be excessively performed because of the use of flux, or misalignment of various parts may occur.

The embodiment of the invention include performing the tabbing process at a temperature equal to or lower than the melting temperature of the solder 24, for example, at about 140° C. to 200° C., so as to prevent or reduce the above-described problems. For this instance, the embodiment of the invention uses the conductive adhesive film 60 capable of performing the tabbing process at a low or lower temperature, for example, at about 140° C. to 200° C., instead of the soldering process using the flux.

FIG. 3 shows that one conductive adhesive film 60 is positioned on each of the front surface and the back surface of the substrate 11. Additionally, two or three conductive adhesive films 60 may be positioned on each of the front surface and the back surface of the substrate 11.

Figure 5:
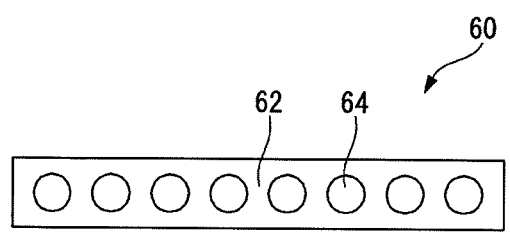
FIG. 5 is a cross-sectional view illustrating a configuration of a conductive adhesive film.

As shown in FIG. 5, the conductive adhesive film 60 includes a resin 62 and conductive particles 64 dispersed in the resin 62. A material of the resin 62 is not particularly limited as long as it has the adhesive property and is melted at a temperature equal to or lower than the melting temperature of the solder 24. It is preferable, but not required, that a thermosetting resin is used for the resin 62 so as to increase an adhesive reliability. The thermosetting resin may use at least one selected among epoxy resin, phenoxy resin, acryl resin, polyimide resin, and polycarbonate resin. Other resins, which may not necessarily be thermosetting, may also be used.

The front electrode current collector 14 and the back electrode current collector 17, to which the conductive adhesive films 60 are respectively attached, serve as a binder and may contain the same material as the resin 62.

The resin 62 may further contain a predetermined material, for example, a curing agent and/or a curing accelerator other than the thermosetting resin. For example, the resin 62 may contain a reforming material such as a silane-based coupling agent, a titanate-based coupling agent, and/or an aluminate-based coupling agent, so as to improve an adhesive strength between the front electrode current collectors 14 and the interconnector 20, and an adhesive strength between the back electrode current collector 17 and the interconnector 20. The resin 62 may contain a dispersant such as calcium phosphate and/or calcium carbonate, so as to improve the dispersibility of the conductive particles 64. The resin 62 may contain a rubber component such as acrylic rubber, silicon rubber, and/or urethane rubber, so as to control the modulus of elasticity of the resin 62.

A material of the conductive particles 64 is not particularly limited as long as it has the conductivity. The conductive particles 64 may contain at least one metal selected among copper (Cu), silver (Ag), gold (Au), iron (Fe), nickel (Ni), lead (Pb), zinc (Zn), cobalt (Co), titanium (Ti), and magnesium (Mg) as the main component. The conductive particles 64 may be formed of metal particles or metal-coated resin particles.

It is preferable, but not required, that the conductive particles 64 use the metal-coated resin particles, so as to mitigate a compressive stress of the conductive particles 64 and to improve a connection reliability of the conductive particles 64. It is preferable, but not required, that the conductive particles 64 have a diameter of about 2 µm to 30 µm, so as to improve the dispersibility of the conductive particles 64. Conductive particles 64 of the same or different diameters may be used in the conductive adhesive films 60.

It is preferable, but not required, that a composition amount of the conductive particles 64 dispersed in the resin 62 is about 10% to 40% based on the total volume of the conductive adhesive film 60 in consideration of the connection reliability after the resin 62 is cured.

When the composition amount of the conductive particles 64 is less than about 10%, a current may not smoothly flow because physical contact areas between the conductive adhesive films 60 and the front and back electrode current collectors 14 and 17 decrease. When the composition amount of the conductive particles 64 is greater than about 40%, the adhesive strength of the conductive adhesive film 60 may be reduced because a composition amount of the resin 62 relatively decreases.

The conductive adhesive film 60 having the above-described configuration may include a cover film.

Figure 6:
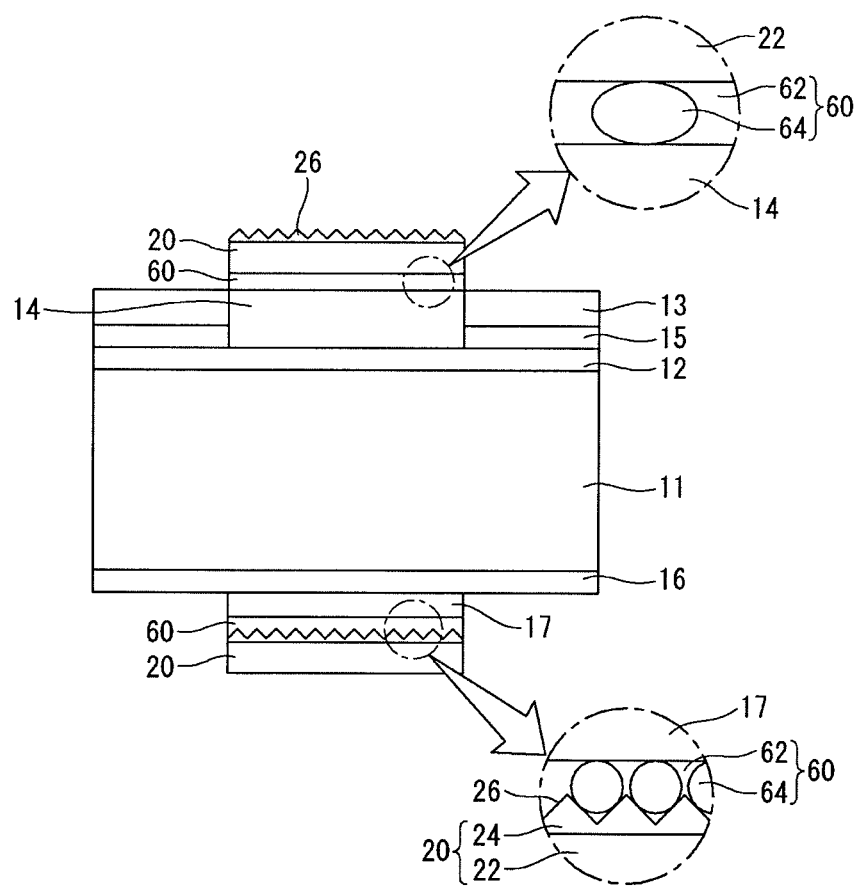
FIG. 6 is a cross-sectional view illustrating an assembly configuration of a solar cell in the solar cell panel shown in FIG. 3.

As shown in FIG. 6, after the tabbing process is completed, the front electrode current collectors 14 and the interconnector 20 are attached to each other using the conductive adhesive film 60, so that the flat lower surface of the interconnector 20 is positioned opposite the front electrode current collectors 14. Further, the back electrode current collector 17 and the interconnector 20 are attached to each other using the conductive adhesive film 60, so that the upper surface of the interconnector 20, on which the uneven portions 26 are formed, is positioned opposite the back electrode current collector 17. In this instance, the tabbing process is performed using the conductive adhesive films 60 capable of performing the operation at the lower temperature.

Accordingly, the uneven portions 26 positioned on the upper surface of the interconnector 20 attached to the front electrode current collectors 14 have the good surface shape or substantially maintain their original shape. Further, the uneven portions 26 positioned on the upper surface of the interconnector 20 attached to the back electrode current collector 17 have the good surface shape or substantially maintain their original shape. A space between the uneven portions 26 is filled with a portion of the conductive adhesive film 60, for example, the resin 62 or the resin 62 and the conductive particles 64.

The conductive particles 64 may directly contact the front electrode current collector 14, the interconnector 20, or both. Further, the conductive particles 64 may directly contact the back electrode current collector 17, the interconnector 20, or both. In this instance, the conductive particles 64 may be modified into an oval shape because of the pressure applied during the tabbing process.

In the structure shown in FIG. 6, because the carriers moving to the front electrode current collectors 14 and the back electrode current collector 17 are directly transferred to the interconnector 20 through the conductive particles 64, a current smoothly flows.

The resin 62 may be positioned between the conductive particles 64 and the front electrode current collectors 14, and between the conductive particles 64 and the interconnector 20. Further, the resin 62 may be positioned between the conductive particles 64 and the back electrode current collector 17, and between the conductive particles 64 and the interconnector 20.

In this instance, carriers moving to the front and back electrode current collectors 14 and 17 jump to the conductive particles 64 and then again jump to the interconnector 20. Further, carriers jumping to the conductive particles 64 may jump to the adjacent conductive particles 64. In other words, the carriers moving to the front and back electrode current collectors 14 and 17 move to the interconnector 20.

A distance between the conductive particles 64 may be properly set so that the carriers can jump between the adjacent conductive particles 64. The distance between the conductive particles 64 may be set by properly adjusting the number and/or the size of the conductive particles 64 dispersed in the resin 62.

A method for manufacturing the solar cell panel according to the example embodiment of the invention is described below with reference to FIG. 7.

The method for manufacturing the solar cell panel according to the example embodiment of the invention mainly includes preliminarily pressing the conductive adhesive films 60 on the front and back electrode current collectors 14 and 17, respectively, aligning and preliminarily fixing the interconnectors 20 on the conductive adhesive films 60, respectively, and primarily pressing the interconnectors 20, the conductive adhesive films 60, and the front and back electrode current collectors 14 and 17 to one another.

The method is characterized by pressing the interconnector 20 using a heating tool, which is heated to a temperature lower than the melting temperature of the solder, in the primarily pressing step to melt the resin 62 of the conductive adhesive film 60.

As shown in FIG. 4, the melting temperature of the solder 24 varies depending on the material thereof, but is equal to or higher than about 180° C.

Accordingly, the method performs the primarily pressing step using a heating tool 70 that is heated to a temperature of about 140° C. to 200° C. depending on the material of the solder 24.

Figure 7:
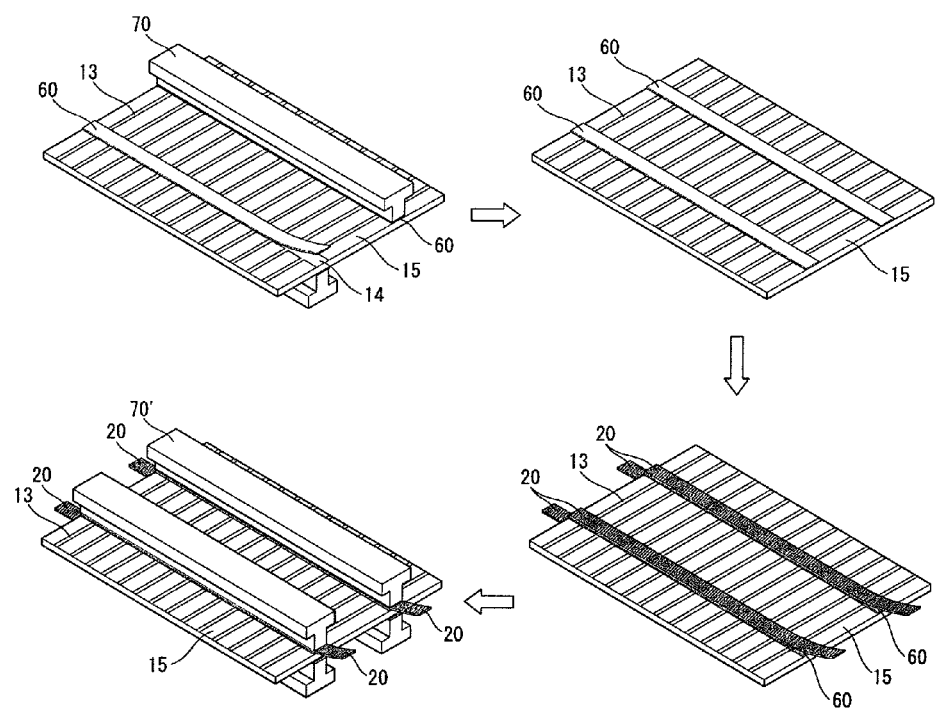
FIG. 7 illustrates a method for manufacturing a solar cell panel according to an example embodiment of the invention.

More specifically, the preliminarily pressing step is a step for first pressing the conductive adhesive films 60 on the front and back electrode current collectors 14 and 17 in a state where the conductive adhesive films 60 are respectively aligned on the front and back electrode current collectors 14 and 17 (see (a) of FIG. 7). The preliminarily pressing step may include pressing the conductive adhesive films 60 using the heating tool 70, that is heated to a temperature of about 60° C. to 120° C., at a pressure of about 0.5 MPa to 1.5 MPa for about 1 second to 10 seconds.

The aligning and preliminarily fixing step may further include removing the cover film positioned on the upper surface of each of the conductive adhesive films 60 preliminarily fixed to the front and back electrode current collectors 14 and 17 (see (b) and (c) of FIG. 7).

The primarily pressing step may include pressing the interconnector 20 using the heating tool 70', which is heated to a temperature of about 140° C. to 200° C., at a pressure of about 1.0 MPa to 5.0 MPa for about 5 seconds to 15 seconds (see (d) of FIG. 7).

When the solar cell panel is manufactured through the above-described method, the uneven portions 26 formed on the upper surface of the interconnector 20 may have the good surface shape. Hence, light incident on the interconnector 20 may be used in solar power generation.

Figure 8:
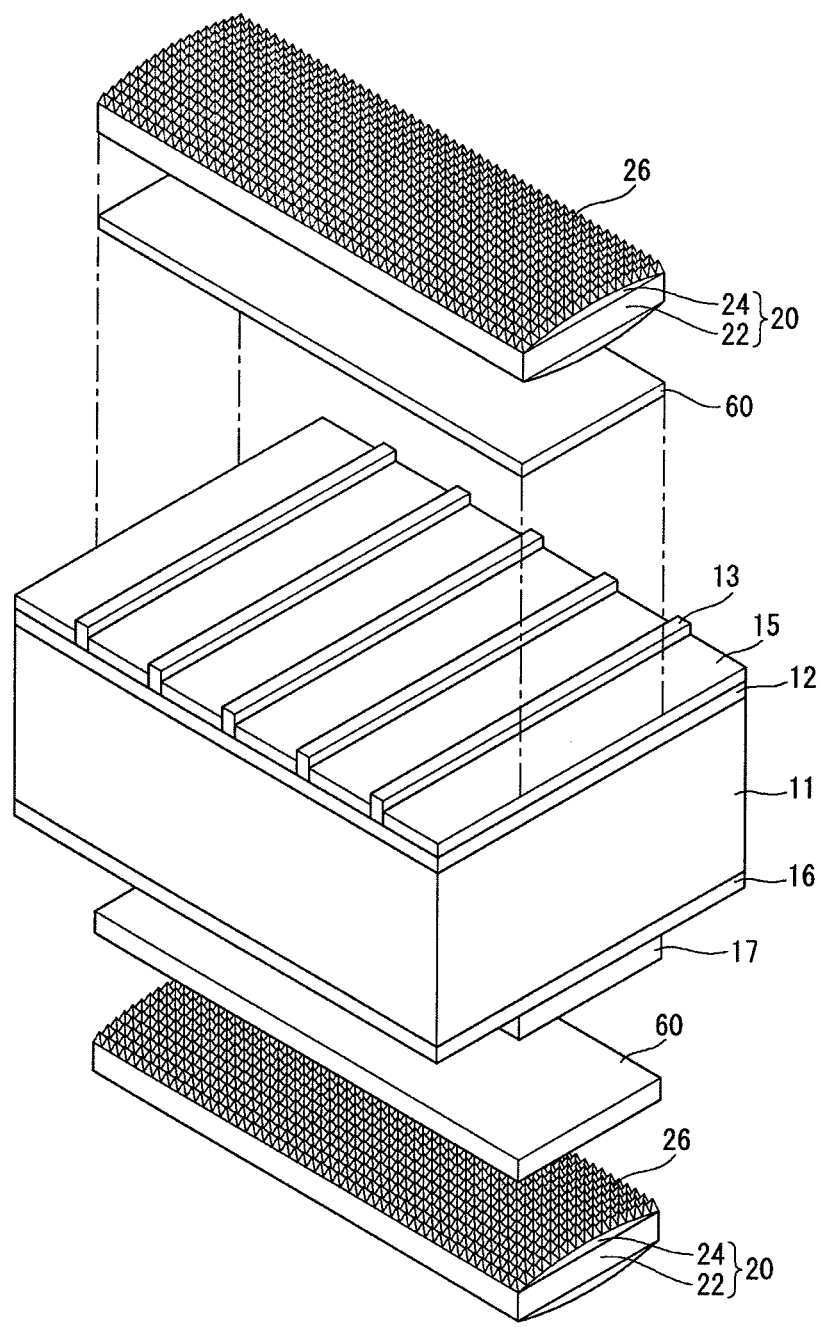
FIG. 8 is an exploded perspective view illustrating another configuration of a solar cell in the solar cell panel shown in FIG. 1.

FIG. 8 is an exploded perspective view illustrating another configuration of a solar cell in the solar cell panel shown in FIG. 1. The embodiment of the solar cell shown in FIG. 8 is similar to the embodiment of the solar cell shown in FIG. 1, except for the plurality of front electrode current collectors 14. That is, in FIG. 8, the plurality of front electrode current collectors are not formed, so that the front conductive adhesive film 60 is positioned on the plurality of front electrodes 13 and the anti-reflection layer 15. Accordingly, first portions of the front conductive adhesive film 60 is in contact with the plurality of front electrodes 13 and second portions of the front conductive adhesive film 60 is in contact with portions of the anti-reflection layer 15. In another embodiment of invention, the anti-reflection layer 15 need not be formed on portions of the emitter layer 12 on which the front conductive adhesive film 60 is to be positioned. In such an instance, the first portions of the front conductive adhesive film 60 will be in contact with the plurality of front electrodes 13 and the second portions of the front conductive adhesive film 60 will be in contact with portions of the emitter layer 12.

Further, because the tabbing process is performed at the low temperature, a bowing phenomenon and a damage of the substrate may be prevented or reduced more sufficiently or readily as compared to when the tabbing process is performed using the soldering at the high temperature.

Further, because the flux is not used, the adhesive strength may be uniformly maintained, and the misalignment may be prevented or reduced. Hence, an output reduction thereof may be prevented or reduced.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell panel comprising:
   a plurality of solar cells, each solar cell including a semiconductor substrate, a front electrode part including a plurality of front electrode current collectors and positioned on a front surface of the semiconductor substrate, and a back electrode part including a plurality of back electrode current collectors and positioned on a back surface of the semiconductor substrate;
   an interconnector configured to electrically connect respective front and back electrode parts of adjacent ones of the plurality of solar cells to one another, the interconnector including a conductive metal and a solder coated on an upper surface and a lower surface of the conductive metal; and
   conductive adhesive layers respectively including a resin and a plurality of conductive particles dispersed in the resin, the conductive adhesive layers being disposed between the respective front and back electrode parts and the interconnector to electrically connect the respective front and back electrode parts to the interconnector,
   wherein the resin of the conductive adhesive layers is formed of a material having a melting temperature lower than a material of the solder, wherein the plurality of front electrode current collectors and the interconnector are attached to each other using a front conductive adhesive layer of the conductive adhesive layers, wherein the plurality of back electrode current collectors and the interconnector are attached to each other using a back conductive adhesive layer of the conductive adhesive layers, wherein each of an upper surface of the solder coated on the upper surface of the conductive metal attached to the front conductive adhesive layer and an upper surface of the solder coated on the upper surface of the conductive metal attached to the back conductive adhesive layer has a plurality of uneven portions, and wherein the plurality of uneven portions of the upper surface of the solder coated on the upper surface of the conductive metal attached to the front conductive adhesive layer and the plurality of uneven portions of the upper surface of the solder coated on the upper surface of the conductive metal attached to the back conductive adhesive layer have the same shape as each other.

2. The solar cell panel of claim 1, wherein the front electrode part of each solar cell further includes a plurality of front electrodes positioned in a direction crossing the plurality of front electrode current collectors.

3. The solar cell panel of claim 2, wherein the plurality of front electrodes of each solar cell and the plurality of front electrode current collectors of each solar cell are connected to an emitter layer positioned at the front surface of the semiconductor substrate.

4. The solar cell panel of claim 2, wherein the back electrode part of each solar cell further includes a back electrode.

5. The solar cell panel of claim 1, wherein a composition amount of the conductive particles dispersed in the resin of the respective conductive adhesive layers is 10% to 40% based on a total volume of the respective conductive adhesive layer.

6. The solar cell panel of claim 1, wherein the plurality of uneven portions on each of the upper surface of the solder coated on the upper surface of the conductive metal attached to the front conductive adhesive layer and the upper surface of the solder coated on the upper surface of the conductive metal attached to the back conductive adhesive layer are uniformly distributed.

7. The solar cell panel of claim 1, wherein each of a lower surface of the solder coated on the lower surface of the conductive metal attached to the front conductive adhesive layer and a lower surface of the solder coated on the lower surface of the conductive metal attached to the back conductive adhesive layer is flat.

8. The solar cell panel of claim 7, wherein the plurality of conductive particles dispersed in the resin of the front conductive adhesive layer are physically contacted with the lower surface of the solder coated on the upper surface of the conductive metal attached to the front conductive adhesive layer and the plurality of front electrode current collectors.

9. The solar cell panel of claim 1, wherein the plurality of uneven portions of the upper surface of the solder coated on the upper surface of the conductive metal attached to the back conductive adhesive layer have a uniform size and the plurality of conductive particles dispersed in the resin of the back conductive adhesive layer are physically contacted with the plurality of uneven portions having the uniform size and each of the plurality of back electrode current collectors.

10. The solar cell panel of claim 1, wherein the plurality of front electrode current collectors and the plurality of back electrode current collectors, to which the conductive adhesive layers are respectively attached, serve as a binder and contain the same material as the resin of the conductive adhesive layers.

11. The solar cell panel of claim 1, wherein the plurality of uneven portions of the upper surface of the solder coated on the upper surface of the conductive metal attached to the back conductive adhesive layer are disposed at intervals, and wherein the plurality of conductive particles dispersed in the resin of the back conductive adhesive layer are disposed in the intervals so that the plurality of uneven portions separate adjacent particles among the plurality of conductive particles dispersed in the resin of the back conductive adhesive layer from one another.

* * * * *